(12) United States Patent
Chiang et al.

(10) Patent No.: US 11,145,730 B2
(45) Date of Patent: Oct. 12, 2021

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Hsin-Che Chiang, Taipei (TW); Ju-Yuan Tzeng, New Taipei (TW); Chun-Sheng Liang, Changhua County (TW); Shu-Hui Wang, Hsinchu (TW); Chih-Yang Yeh, Hsinchu County (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/678,642

(22) Filed: Nov. 8, 2019

(65) Prior Publication Data
US 2020/0075741 A1 Mar. 5, 2020

Related U.S. Application Data

(62) Division of application No. 15/628,740, filed on Jun. 21, 2017, now Pat. No. 10,475,895.
(Continued)

(51) Int. Cl.
*H01L 27/092* (2006.01)
*H01L 29/423* (2006.01)
(Continued)

(52) U.S. Cl.
CPC ............ *H01L 29/42364* (2013.01); *H01L 21/823431* (2013.01); *H01L 21/823437* (2013.01);
(Continued)

(58) Field of Classification Search
CPC ..... H01L 21/823431; H01L 21/823462; H01L 21/823864; H01L 29/6681;
(Continued)

(56) References Cited

U.S. PATENT DOCUMENTS

| | | | |
|---|---|---|---|
| 6,465,290 B1 * | 10/2002 | Suguro et al. | H01L 29/66545 438/183 |
| 7,126,199 B2 | 10/2006 | Doczy et al. | |

(Continued)

*Primary Examiner* — Mary A Wilczewski
*Assistant Examiner* — Tsz K Chiu
(74) *Attorney, Agent, or Firm* — Maschoff Brennan

(57) ABSTRACT

A semiconductor device includes a substrate, a first gate structure, a plurality of first gate spacers, a second gate structure, and a plurality of second gate spacers. The substrate has a first fin structure and a second fin structure. The first gate structure is over the first fin structure, in which the first gate structure includes a first high dielectric constant material and a first metal. A bottom surface of the first high dielectric constant material is higher than bottom surfaces of the first gate spacers. The second gate structure is narrower than the first gate structure and over the second fin structure, in which the second gate structure includes a second high dielectric constant material and a second metal. A bottom surface of the second high dielectric constant material is lower than bottom surfaces of the second gate spacers.

20 Claims, 14 Drawing Sheets

Related U.S. Application Data

(60) Provisional application No. 62/511,329, filed on May 25, 2017.

(51) Int. Cl.
| | |
|---|---|
| *H01L 29/49* | (2006.01) |
| *H01L 27/088* | (2006.01) |
| *H01L 29/66* | (2006.01) |
| *H01L 21/8234* | (2006.01) |
| *H01L 21/3213* | (2006.01) |
| *H01L 21/8238* | (2006.01) |
| *H01L 29/40* | (2006.01) |
| *H01L 29/51* | (2006.01) |
| *H01L 29/417* | (2006.01) |
| *H01L 29/43* | (2006.01) |
| *H01L 29/78* | (2006.01) |
| *H01L 29/165* | (2006.01) |

(52) U.S. Cl.
CPC .. *H01L 21/823462* (2013.01); *H01L 27/0886* (2013.01); *H01L 29/4966* (2013.01); *H01L 29/6653* (2013.01); *H01L 29/66545* (2013.01); *H01L 29/66795* (2013.01); *H01L 21/3213* (2013.01); *H01L 21/823821* (2013.01); *H01L 21/823864* (2013.01); *H01L 27/088* (2013.01); *H01L 27/0924* (2013.01); *H01L 29/165* (2013.01); *H01L 29/401* (2013.01); *H01L 29/41791* (2013.01); *H01L 29/435* (2013.01); *H01L 29/4958* (2013.01); *H01L 29/513* (2013.01); *H01L 29/517* (2013.01); *H01L 29/6681* (2013.01); *H01L 29/7848* (2013.01)

(58) Field of Classification Search
CPC .......... H01L 29/66545; H01L 29/6659; H01L 29/66537; H01L 21/3213; H01L 29/7848; H01L 29/66795; H01L 29/517; H01L 29/513; H01L 29/41791; H01L 29/435; H01L 29/4958; H01L 29/4966; H01L 29/401

See application file for complete search history.

(56) References Cited

U.S. PATENT DOCUMENTS

| | | |
|---|---|---|
| 7,390,709 B2 | 6/2008 | Doczy et al. |
| 7,531,437 B2 | 5/2009 | Brask et al. |
| 8,530,294 B2 | 9/2013 | Lee et al. |
| 8,859,371 B2 | 10/2014 | Song et al. |
| 9,177,807 B2 * | 11/2015 | Shinohara et al. ............ H01L 21/28273 |
| 9,576,980 B1 | 2/2017 | Basker et al. |
| 9,741,720 B1 * | 8/2017 | Siddiqui ............... H01L 29/518 |
| 9,812,448 B2 * | 11/2017 | Kwon .................. H01L 27/088 |
| 9,837,504 B2 * | 12/2017 | Chen ................ H01L 29/42372 |
| 9,865,703 B2 * | 1/2018 | Ando ............... H01L 29/66795 |
| 9,887,136 B2 | 2/2018 | Chang et al. |
| 9,899,491 B2 * | 2/2018 | Su .................... H01L 29/66553 |
| 9,929,157 B1 | 3/2018 | Xie et al. |
| 9,972,495 B1 | 5/2018 | Wu |
| 9,985,023 B1 | 5/2018 | Liu et al. |
| 10,461,158 B2 * | 10/2019 | Yamamoto et al. ........ H01L 29/1083 |
| 2009/0057769 A1 | 3/2009 | Wei et al. |
| 2013/0302976 A1* | 11/2013 | Tsai .................... H01L 29/6681 438/589 |
| 2014/0203335 A1 | 7/2014 | Song et al. |

* cited by examiner

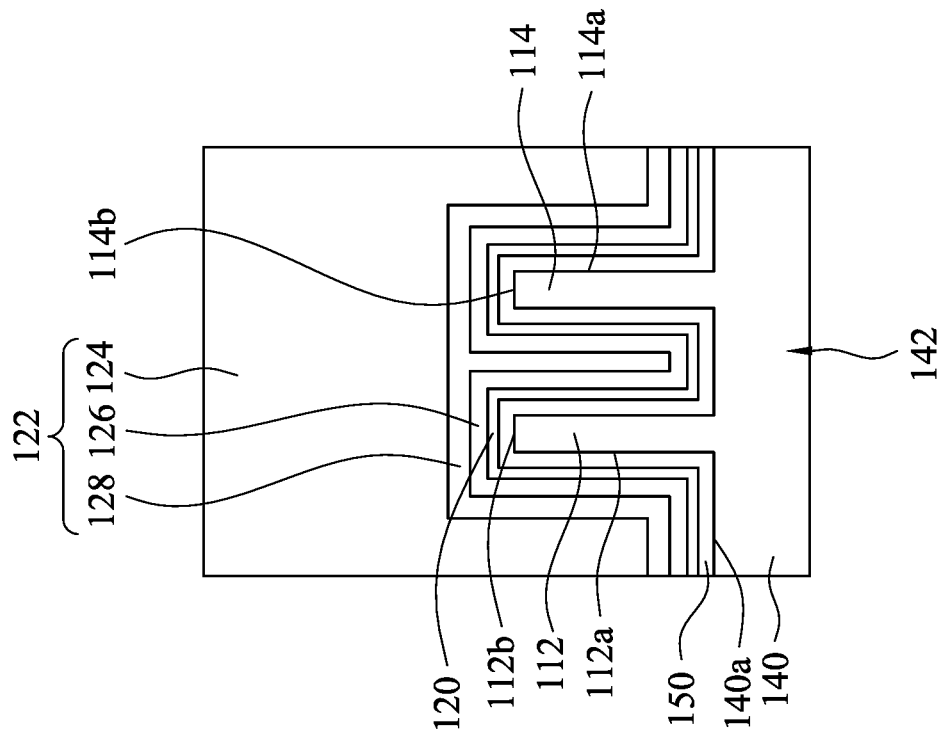
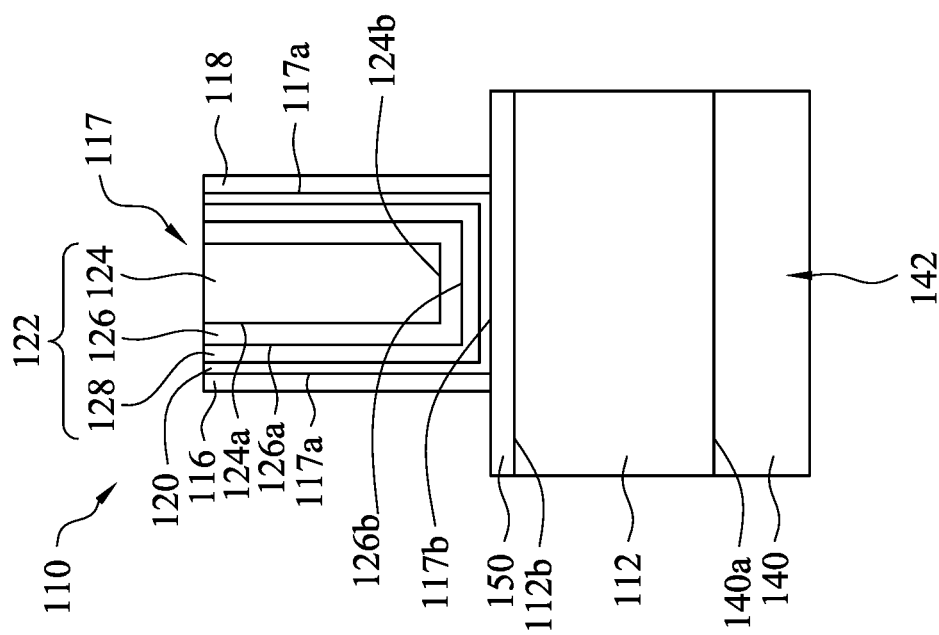
FIG. 2B
FIG. 2A

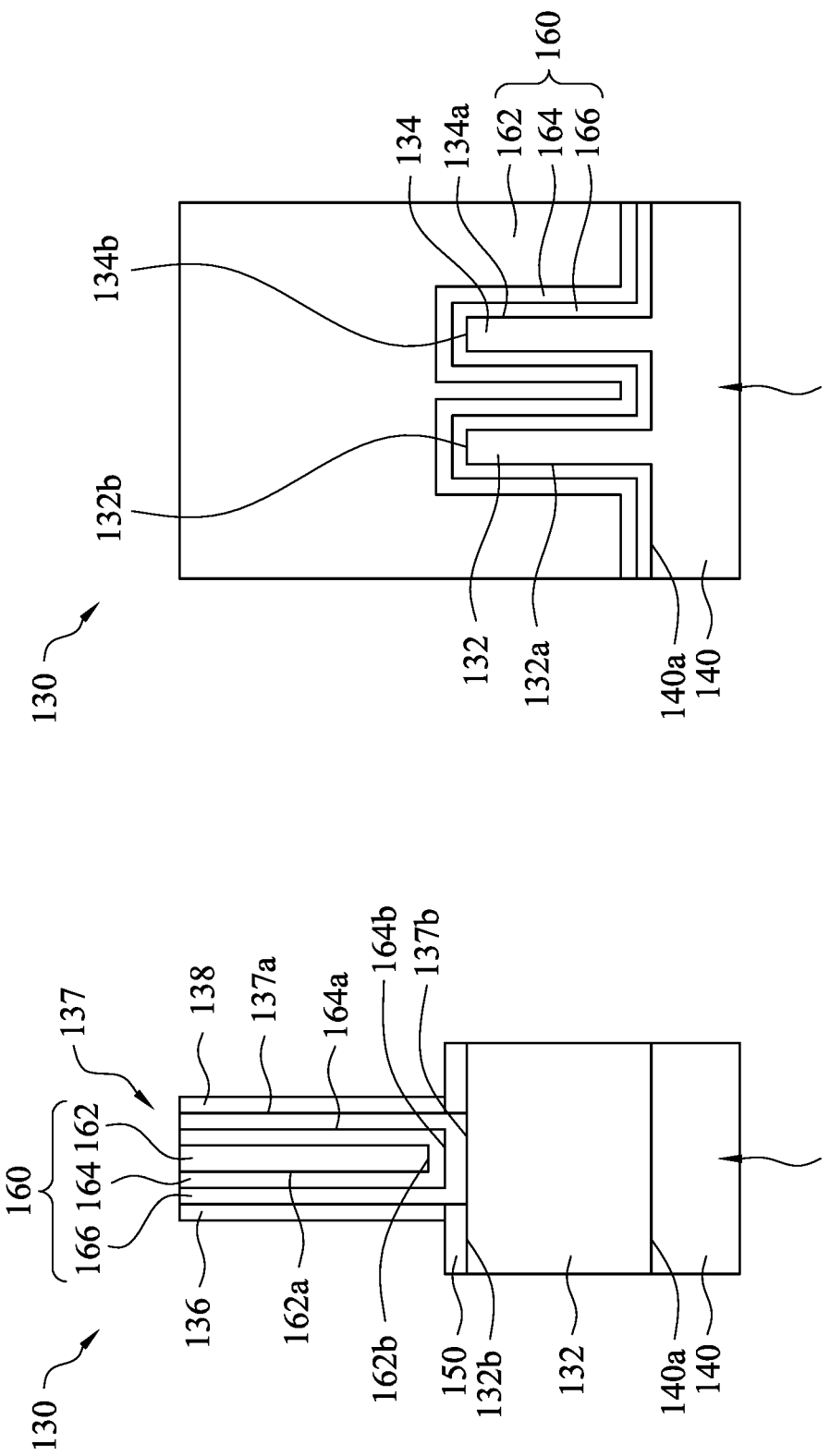

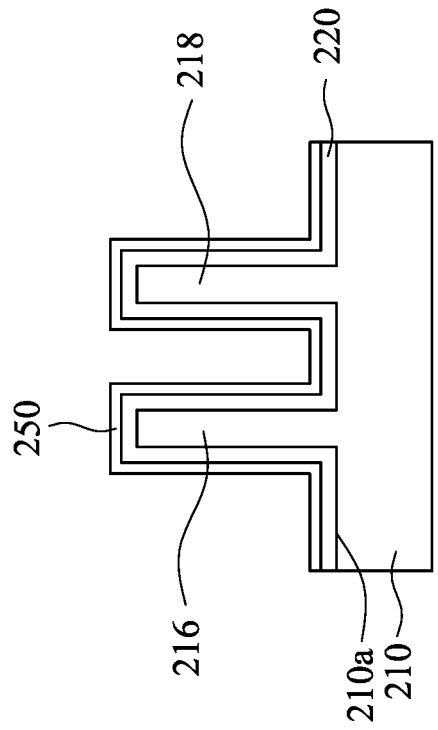
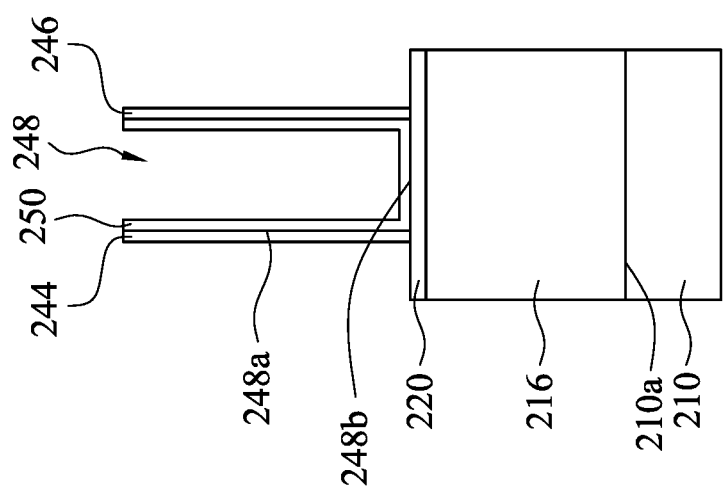
FIG. 6D
FIG. 6C

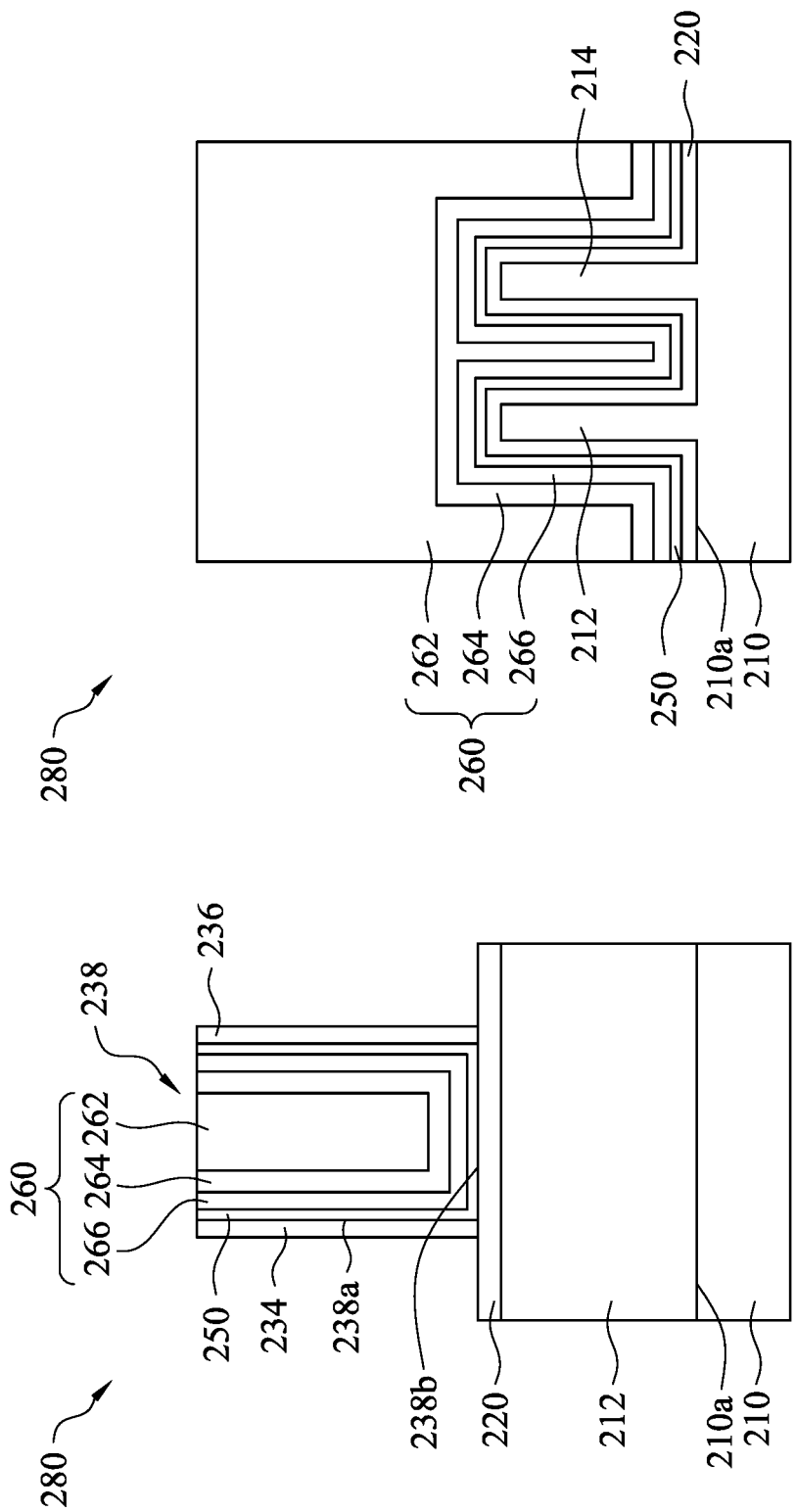

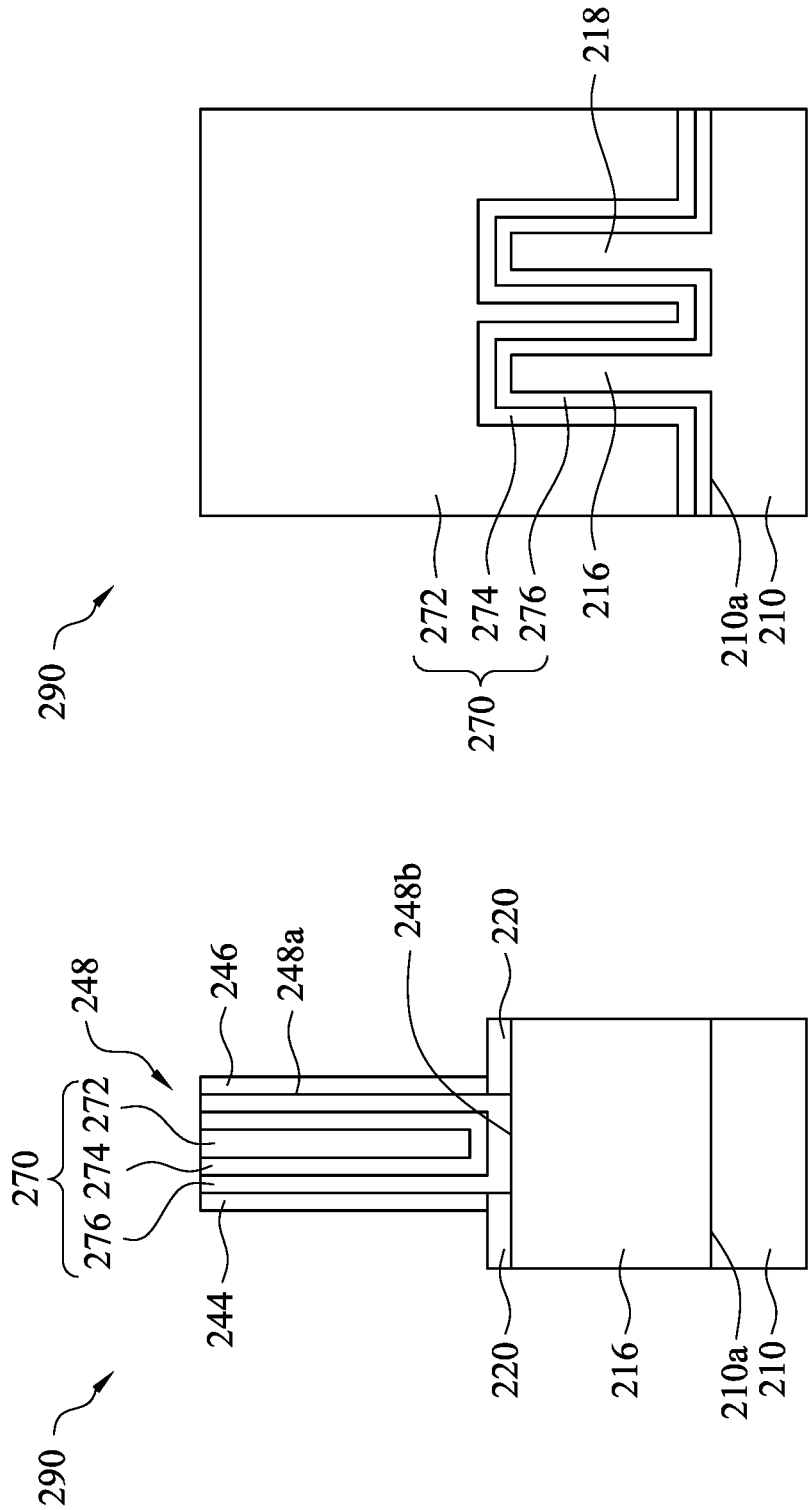

SEMICONDUCTOR DEVICE AND METHOD FOR MANUFACTURING THE SAME

RELATED APPLICATIONS

The present application is a Divisional application of U.S. application Ser. No. 15/628,740, filed on Jun. 21, 2017, now U.S. Pat. No. 10,475,895, issued on Nov. 12, 2019, which claims priority of U.S. Provisional Application Ser. No. 62/511,329, filed May 25, 2017, which is herein incorporated by reference in their entireties.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is schematic cross-sectional view of the semiconductor device in FIG. 1 taken along a line A-A.

FIG. 2B is schematic cross-sectional view of the semiconductor device in FIG. 1 taken along a line B-B.

FIG. 3A is schematic cross-sectional view of the semiconductor device in FIG. 1 taken along a line C-C.

FIG. 3B is schematic cross-sectional view of the semiconductor device in FIG. 1 taken along a line D-D.

FIG. 4A through FIG. 8D are schematic cross-sectional views of intermediate stages showing a method for manufacturing the semiconductor device shown in FIG. 9 in accordance with various embodiments, in which FIG. 4A, FIG. 5A, FIG. 6A, FIG. 7A, and FIG. 8A are taken along a line A-A shown in FIG. 9, FIG. 4B, FIG. 5B, FIG. 6B, FIG. 7B, and FIG. 8B are taken along a line B-B shown in FIG. 9, FIG. 4C, FIG. 5C, FIG. 6C, FIG. 7C, and FIG. 8C are taken along a line C-C shown in FIG. 9, and FIG. 4D, FIG. 5D, FIG. 6D, FIG. 7D, and FIG. 8D are taken along a line D-D shown in FIG. 9.

DETAILED DESCRIPTION

Figure 1:
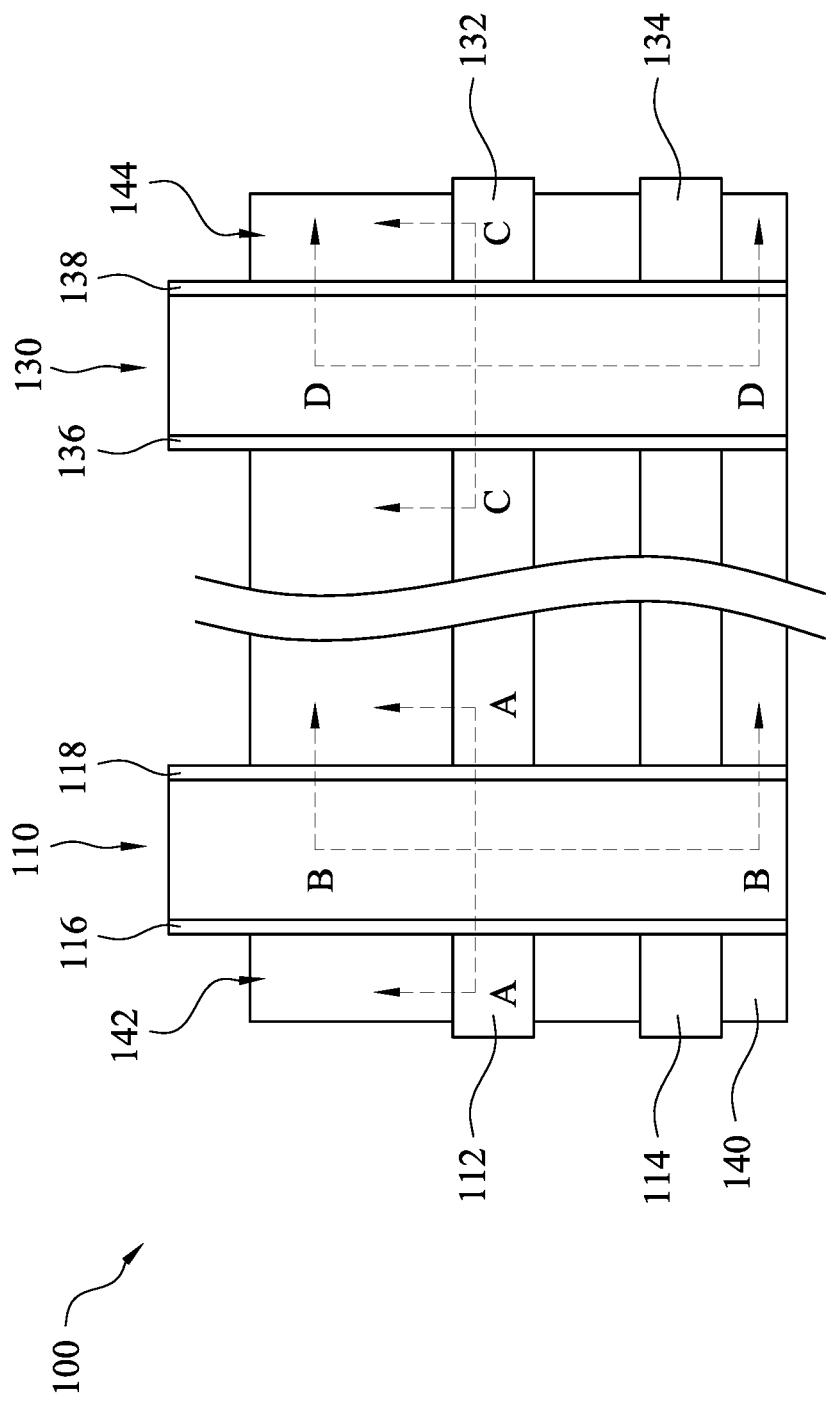
FIG. 1 is schematic top view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In a typical process for manufacturing a semiconductor device, dummy gate structures, each of which includes a dummy gate and two spacers sandwiching the dummy gate, are formed on a gate dielectric layer covering fin structures, then each dummy gate is removed to form a trench between the spacers sandwiching the dummy gate, and portions of the gate dielectric layer in the trenches in core regions are removed. After the portions of the gate dielectric layer in the trenches in the core regions are removed, each of the trenches is filled with another gate dielectric layer and a metal gate. However, as the semiconductor IC industry has progressed into nanometer technology process nodes, space between two adjacent fin structures is getting smaller, such that it is difficult to remove the dummy gates completely, portions of the dummy gates may remain in the trenches, and thus resulting in contaminants and metal gate extrusion.

Embodiments of the present disclosure are directed to providing a semiconductor device and a method for manufacturing the semiconductor device, in which after dummy gates are removed to expose a first dielectric layer, a second dielectric layer is formed to cover the first dielectric layer. The second dielectric layer is formed after the dummy gates are removed, such that second dielectric layer is not damaged during the removing of the dummy gates, and thus the quality of the gate dielectric structure composed of the first dielectric layer and the second dielectric layer is improved. Furthermore, the second dielectric layer can cover the undesired dummy gate remains on the first dielectric layer, thereby preventing the contamination and the metal gate extrusion.

FIG. 1 is schematic top drawing of a semiconductor device in accordance with various embodiments. In some examples, the semiconductor device 100 is a FinFET device. The semiconductor device 100 may include a first device 110 and a second device 130. In some exemplary examples, the first device 110 is an input/output (IO) device, and the second device 130 is a core device.

Referring to FIG. 2A through FIG. 3B with FIG. 1, FIG. 2A is schematic cross-sectional view of the semiconductor device in FIG. 1 taken along a line A-A, FIG. 2B is schematic cross-sectional view of the semiconductor device in FIG. 1 taken along a line B-B, FIG. 3A is schematic cross-sectional view of the semiconductor device in FIG. 1 taken along a line C-C, and FIG. 3B is schematic cross-sectional view of the semiconductor device in FIG. 1 taken along a line D-D. In some examples, the semiconductor device 100 includes a substrate 140, a first dielectric layer 150, the first device 110, and the second device 130.

As shown in FIG. 1, the substrate 140 may include a first region 142 and a second region 144, in which the first device 110 is disposed on the first region 142, and the second device 130 is disposed on the second region 144. For example, the first region 142 of the substrate 140 may be an IO region, and the second region 144 of the substrate 140 may be a core region. In some exemplary examples, as shown in FIG. 1, the first device 110 of the semiconductor device 100 further includes one or more first fin structures 112 and 114, and the second device 130 further includes one or more second fin structures 132 and 134. The first fin structures 112 and 114 are disposed on the first region 142 of the substrate 140, and the second fin structures 132 and 134 are disposed on the second region 144 of the substrate 140.

In some exemplary examples, the first fin structures 112 and 114 and the second fin structures 132 and 134 are formed by recessing the substrate 140, and thus the first fin structures 112 and 114 and the second fin structures 132 and 134 protrudes from a recessed surface 140a of the substrate 140. The first fin structures 112 and 114, the second fin structures 132 and 134, and the substrate 140 are formed from the same material. The substrate 140, the first fin structures 112 and 114, and the second fin structures 132 and 134 may be composed of a single-crystalline semiconductor material or a compound semiconductor material. For example, silicon, germanium or glass may be used as a material of the substrate 140, the first fin structures 112 and 114, and the second fin structures 132 and 134.

The first dielectric layer 150 is disposed on portions of the surface 140a of the substrate 140. In the examples that the first device 110 includes the first fin structures 112 and 114 and the second device 130 includes the second fin structures 132 and 134, the first dielectric layer 150 covers portions of the first fin structures 112 and 114 and portions of the second fin structures 132 and 134. For example, the first dielectric layer 150 may be conformal to the first fin structures 112 and 114 and the second fin structures 132 and 134. For example, a material forming the first dielectric layer 150 may include silicon oxide, silicon nitride, silicon oxynitride, or combinations thereof. In some exemplary examples, a thickness of the first dielectric layer 150 is substantially in a range from 1 nm to 2 nm.

Referring to FIG. 1, FIG. 2A, and FIG. 2B, the first device 110 is disposed on the first dielectric layer 150 on the first region 142 of the substrate 140. In some examples, the first device 110 includes two first spacers 116 and 118, at least one second dielectric layer 120, and a first gate structure 122. The first spacers 116 and 118 are disposed on the first dielectric layer 150 across the first fin structures 112 and 114. As shown in FIG. 2A, the first spacers 116 and 118 are separated from each other to form a first trench 117 over the first dielectric layer 150. In some exemplary examples, the first spacers 116 and 118 are formed from silicon nitride, silicon oxynitride, or combinations thereof.

As shown in FIG. 2B, the second dielectric layer 120 is disposed on the first dielectric layer 150 on side surface 112a and a top surface 112b of the first fin structure 112, and on side surface 114a and a top surface 114b of the first fin structure 114. As shown in FIG. 2A, the second dielectric layer 120 is further disposed on first side surfaces 117a and a first bottom surface 117b of the first trench 117. In some exemplary examples, the second dielectric layer 120 is conformal to the first trench 117. A material forming the second dielectric layer 120 is the same as a material forming the first dielectric layer 150. For example, a material forming the second dielectric layer 120 may include silicon oxide, silicon nitride, silicon oxynitride, or combinations thereof. In some exemplary examples, the first device 110 includes two or more second dielectric layers 120, and a thickness of each of the second dielectric layers 120 is substantially in a range from 0.5 nm to 1 nm.

Referring to FIG. 2B again, the first gate structure 122 is disposed on the second dielectric layer 120 over the first fin structures 112 and 114 and portions of the surface 140a of the substrate 140. As shown in FIG. 2A, the first gate structure 122 is disposed within the first trench 117. In some exemplary examples, the first gate structure 122 includes a gate 124, a metal layer 126, and a third dielectric layer 128. The third dielectric layer 128 is disposed on the second dielectric layer 120 over the first fin structures 112 and 114, and on the first side surfaces 117a and the first bottom surface 117b of the first trench 117. In some exemplary examples, the third dielectric layer 128 is conformal to the second dielectric layer 120. For example, the third dielectric layer 128 may be formed from a high dielectric constant dielectric material.

As shown in FIG. 2A and FIG. 2B, the metal layer 126 is disposed on the third dielectric layer 128. The third dielectric layer 128 covers side surfaces 126a and a bottom surface 126b of the metal layer 126 in the first trench 117. In some exemplary examples, the metal layer 126 is conformal to the third dielectric layer 128. For example, the metal layer 126 may be formed from titanium nitride. The gate 124 is disposed on the metal layer 126 within the first trench 117. The metal layer 126 covers side surfaces 124a and a bottom surface 124b of the gate 124 in the first trench 117, such that the metal layer 126 is sandwiched between the gate 124 and the third dielectric layer 128. For example, a material of the gate 124 may include tungsten.

Referring to FIG. 1, FIG. 3A, and FIG. 3B, the second device 130 is disposed on the second region 144 of the substrate 140. In some examples, the second device 130 includes two second spacers 136 and 138, and a second gate structure 160. The second spacers 136 and 138 are disposed on the first dielectric layer 150 across the second fin structures 132 and 134. As shown in FIG. 3A, the second spacers 136 and 138 are separated from each other to form a second trench 137 on the second fin structures 132 and 134 over the surface 140a of the substrate 140. The second trench 137 exposes a portion of a top surface 132b and portions of side surfaces 132a of the second fin structure 132, and a portion of a top surface 134b and portions of side surfaces 134a of the second fin structure 134. In some exemplary examples, the second spacers 136 and 138 are formed from silicon nitride, silicon oxynitride, or combinations thereof.

As shown in FIG. 3B, the second gate structure 160 is disposed on the first fin structures 132 and 134 and portions of the surface 140a of the substrate 140 within the second trench 137. As shown in FIG. 3A, the second gate structure 160 is disposed within the second trench 137. In some exemplary examples, the second gate structure 160 includes a gate 162, a metal layer 164, and a third dielectric layer 166. The third dielectric layer 166 is disposed on the side surfaces 132a and the top surface 132b of the second fin structure 132, the side surfaces 134a and the top surface 134b of the second fin structure 134, and second side surfaces 137a and a second bottom surface 137b of the second trench 137. In some exemplary examples, the third dielectric layer 166 is conformal to the second trench 137. For example, the third dielectric layer 166 may be formed from a high dielectric constant dielectric material.

As shown in FIG. 3A and FIG. 3B, the metal layer 164 is disposed on the third dielectric layer 166 within the second trench 137. The third dielectric layer 166 covers side surfaces 164a and a bottom surface 164b of the metal layer 164 in the second trench 137. In some exemplary examples, the metal layer 164 is conformal to the third dielectric layer 166. For example, the metal layer 164 may be formed from titanium nitride. The gate 162 is disposed on the metal layer 164 within the second trench 137. The metal layer 164 covers side surfaces 162a and a bottom surface 162b of the gate 162 in the second trench 137, such that the metal layer 164 is sandwiched between the gate 162 and the third dielectric layer 166. For example, a material of the gate 162 may include tungsten.

Figure 9:
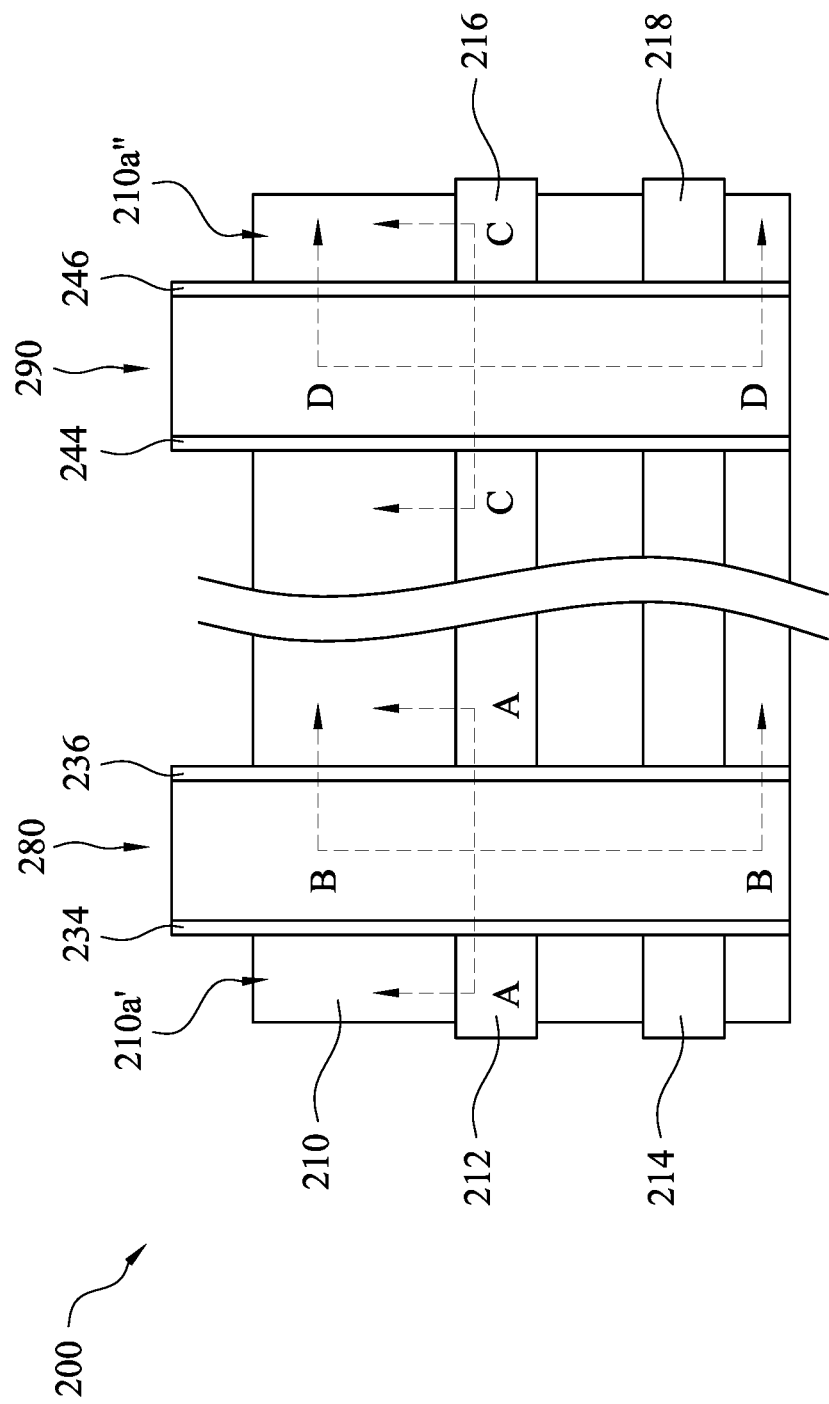
FIG. 9 is schematic top view of a semiconductor device in accordance with various embodiments.

Referring to FIG. 9 with FIG. 4A through FIG. 8D, FIG. 9 is schematic top view of a semiconductor device in accordance with various embodiments, FIG. 4A through FIG. 8D are schematic cross-sectional views of intermediate stages showing a method for manufacturing the semiconductor device shown in FIG. 9 in accordance with various embodiments, in which FIG. 4A, FIG. 5A, FIG. 6A, FIG. 7A, and FIG. 8A are taken along a line A-A shown in FIG. 9, FIG. 4B, FIG. 5B, FIG. 6B, FIG. 7B, and FIG. 8B are taken along a line B-B shown in FIG. 9, FIG. 4C, FIG. 5C, FIG. 6C, FIG. 7C, and FIG. 8C are taken along a line C-C shown in FIG. 9, and FIG. 4D, FIG. 5D, FIG. 6D, FIG. 7D, and FIG. 8D are taken along a line D-D shown in FIG. 9.

In manufacturing a semiconductor device 200 shown in FIG. 9, a substrate 210 is provided. In some examples, as shown in FIG. 4A through FIG. 4D, the substrate 210 is provided with one or more first fin structures 212 and 214, and one or more second fin structures 216 and 218. The first fin structures 212 and 214 and the second fin structures 216 and 218 respectively protrude from a first region 210a' and a second region 210a" of a surface 210a of the substrate 210. For example, the first region 210a' of the substrate 210 may be an IO region, and the second region 210a" of the substrate 210 may be a core region. In some exemplary examples, the first fin structures 212 and 214 and the second fin structures 216 and 218 are formed by recessing the substrate 210. Thus, the first fin structures 212 and 214, the second fin structures 216 and 218, and the substrate 210 are formed from the same material. The substrate 210, the first fin structures 212 and 214, and the second fin structures 216 and 218 may be composed of a single-crystalline semiconductor material or a compound semiconductor material. For example, silicon, germanium or glass may be used as a material of the substrate 210, the first fin structures 212 and 214, and the second fin structures 216 and 218.

Referring to FIG. 4A through FIG. 4D, a first dielectric layer 220 is formed to cover portions of the first fin structures 212 and 214, portions of the second fin structures 216 and 218, and a portion of the surface 210a of the substrate 210. For example, the first dielectric layer 220 may be formed by using a thermal oxidation technique or a deposition technique, such as a chemical vapor deposition (CVD) technique. For example, the first dielectric layer 220 may be conformal to the first fin structures 212 and 214 and the second fin structures 216 and 218. For example, a material forming the first dielectric layer 220 may include silicon oxide, silicon nitride, silicon oxynitride, or combinations thereof. In some exemplary examples, the first dielectric layer 220 is formed to have a thickness which is substantially in a range from 1 nm to 2 nm.

As shown in FIG. 5A through FIG. 5D, at least one first dummy gate structure 230 and at least one second dummy gate structure 240 are respectively formed on the first dielectric layer 220 across the portions of the first fin structures 212 and 214 and the portions of the second fin structure 216 and 218. The first dummy gate structure 230 and the second dummy gate structure 240 are respectively disposed on the first region 210a' and the second region 210a" of the surface 210a of the substrate 210. In some exemplary examples, the first dummy gate structure 230 is formed to include a first dummy gate 232 and two first spacers 234 and 236 sandwiching the first dummy gate 232, and the second dummy gate structure 240 is formed to include a second dummy gate 242 and two second spacers 244 and 246 sandwiching the second dummy gate 242. For example, the first dummy gate 232 and the second dummy gate 242 may be formed from polysilicon, the first spacers 234 and 236 and the second spacers 244 and 246 may be formed from silicon nitride, silicon oxynitride, or combinations thereof.

As shown in FIG. 6A through FIG. 6D, the first dummy gate 232 and the second dummy gate structure 240 are removed to respectively form a first trench 238 between the first spacers 234 and 236, and a second trench 248 between the second spacers 244 and 246. The first trench 238 is formed over the portions of the first fin structures 212 and 214. The second trench 248 is formed over the portions of the second fin structures 216 and 218. The first trench 238 is formed to include first side surfaces 238a and a first bottom surface 238b, in which the first side surfaces 238a are respectively connected to opposite sides of the first bottom surface 238b. The second trench 248 is formed to include second side surfaces 248a and a second bottom surface 248b, in which the second side surfaces 248a are respectively connected to opposite sides of the second bottom surface 248b. The first bottom surface 238b of the first trench 238 and the second bottom surface 248b of the second trench 248 expose portions of the first dielectric layer 220. In some exemplary examples, the first dummy gate 232 and the second dummy gate structure 240 are removed by using an etch technique.

Figure 6B:
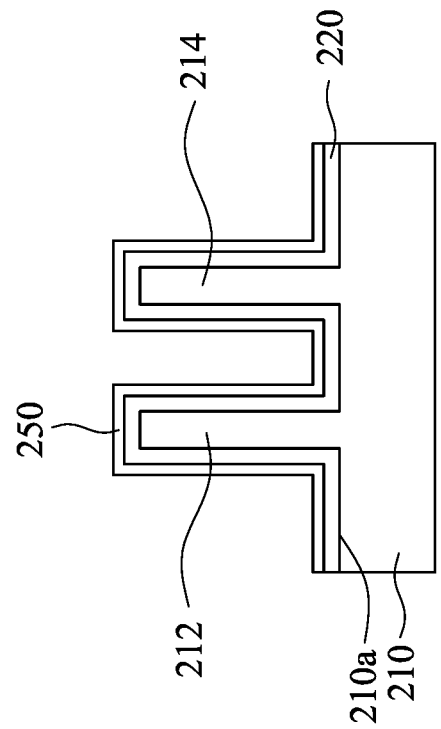
Figure 6A:
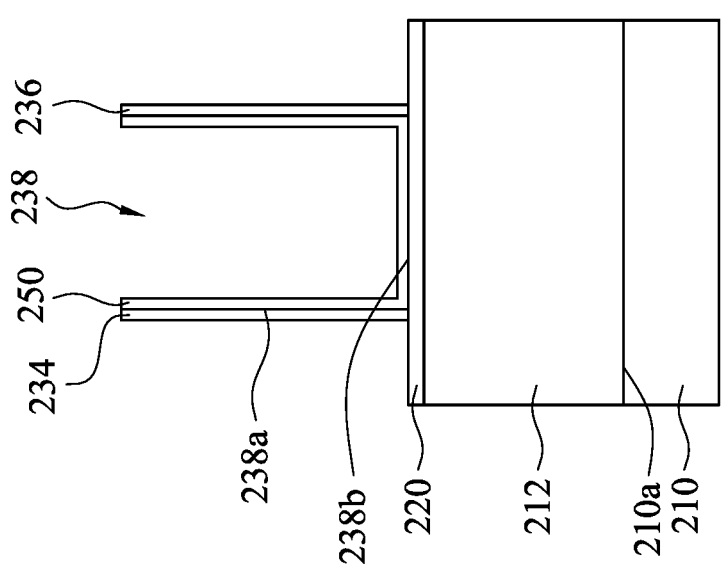
Figure 7B:
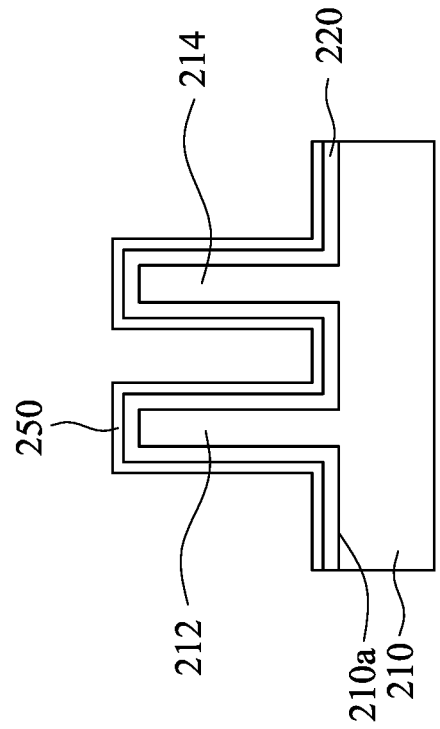
Figure 7A:
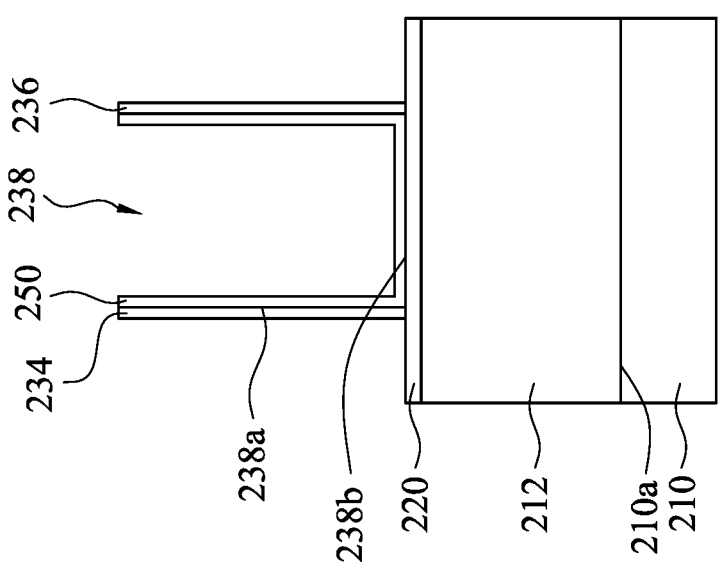
Figure 7D:
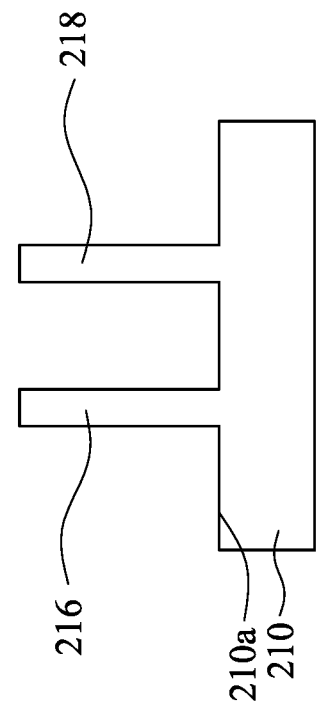
Figure 7C:
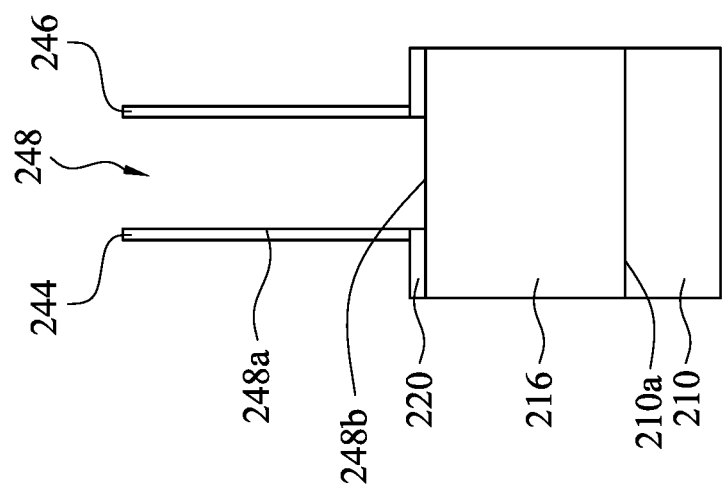

Referring to FIG. 6A through FIG. 6D again, at least one second dielectric layer 250 is formed on the first dielectric layer 220, the first side surfaces 238a and the first bottom surface 238b of the first trench 238, and the second side surfaces 248a and the second bottom surface 248b of the second trench 248. For example, the second dielectric layer 250 may be formed by using a chemical vapor deposition technique. In some exemplary examples, the second dielectric layer 250 is conformal to the first trench 238 and the second trench 248. A material forming the second dielectric layer 250 may be the same as a material forming the first dielectric layer 220. For example, a material forming the second dielectric layer 250 may include silicon oxide, silicon nitride, silicon oxynitride, or combinations thereof. In some exemplary examples, two or more second dielectric layers 250 may be formed, and a thickness of each of the second dielectric layers 250 is substantially in a range from 0.5 nm to 1 nm.

As shown in FIG. 7A through FIG. 7D, a portion of the first dielectric layer 220 and a portion of the second dielectric layer 250, which are located in the second trench 248, are removed, to expose the second side surfaces 248a of the second trench 248 and to extend the second bottom surface 248b of the second trench 248 to the second fin structures 216 and 218 and portions of the surface 210a of the substrate 210 within the second trench 248. For example, the removing of the portion of the first dielectric layer 220 and the portion of the second dielectric layer 250 may include masking the other portion of the second dielectric layer 250, and etching the portion of the second dielectric layer 250 and the portion of the first dielectric layer 220.

As shown in FIG. 8A through FIG. 8D, the first trench 238 and the second trench 248 are respectively filled with a first gate structure 260 and a second gate structure 270. The first gate structure 260 is disposed on the second dielectric layer 250 within the first trench 238, and the second gate structure 270 is disposed on the second fin structures 216 and 218 and the portions of the surface 210a of the substrate 210 within the second trench 248.

In some examples, as shown in FIG. 8A and FIG. 8B, in forming the first gate structure 260, a third dielectric layer 266 is formed to cover the second dielectric layer 250 on the first side surfaces 238a and the first bottom surface 238b of the first trench 238. For example, the third dielectric layer 266 may be formed by using a chemical vapor deposition technique. In some exemplary examples, the third dielectric layer 266 is conformal to the second dielectric layer 250. For example, the third dielectric layer 266 may be formed from a high dielectric constant dielectric material. A metal layer 264 is formed to cover the third dielectric layer 266 within the first trench 238 by using, for example, a chemical vapor deposition technique or a physical vapor deposition technique. In some exemplary examples, the metal layer 264 is conformal to the third dielectric layer 266 within the first trench 238. For example, the metal layer 264 may be formed from titanium nitride. A gate 262 is formed on the metal layer 264 and fills the first trench 238 to substantially complete a first device 280, in which the metal layer 264 is sandwiched between the gate 262 and the third dielectric layer 266. The gate 262 may be formed by using a physical vapor deposition technique. For example, a material of the gate 262 may include tungsten. In some exemplary examples, the first device 280 is an IO device.

In some examples, as shown in FIG. 8C and FIG. 8D, in forming the second gate structure 270, a third dielectric layer 276 is formed to cover the second side surfaces 248a and the second bottom surface 248b of the second trench 248. In some exemplary examples, the third dielectric layer 276 is conformal to the second side surfaces 248a and the second bottom surface 248b of the second trench 248. For example, the third dielectric layer 276 may be formed from a high dielectric constant dielectric material. A metal layer 274 is formed to cover the third dielectric layer 276 within the second trench 248 by using, for example, a chemical vapor deposition technique or a physical vapor deposition technique. In some exemplary examples, the metal layer 274 is conformal to the third dielectric layer 276 within the second trench 248. For example, the metal layer 274 may be formed from titanium nitride. A gate 272 is formed on the metal layer 274 and fills the second trench 248 to substantially complete a second device 290, and thus substantially completing the semiconductor 200 shown in FIG. 9. The metal layer 274 is sandwiched between the gate 272 and the third dielectric layer 276. The gate 272 may be formed by using a physical vapor deposition technique. For example, a material of the gate 272 may include tungsten. The first gate structure 260 and the second gate structure 270 may be formed simultaneously. In some exemplary examples, the second device 290 is a core device.

After the first dummy gate 232 and the second dummy gate 242 are removed, the second dielectric layer 250 is formed to cover the first dielectric layer 220, such that the remaining portions of the first dummy gate 232 and the second dummy gate 242 on the first dielectric layer 220 can be covered by the second dielectric layer 250, and the second dielectric layer 250 is not damaged during the removing of the first dummy gate 232 and the second dummy gate 242. Thus, the quality of the gate dielectric structure composed of the first dielectric layer and the second dielectric layer is improved, and the contamination resulted from the remaining portions of the first dummy gate 232 and the second dummy gate 242 is prevented, thereby preventing the metal gate extrusion.

Figure 10:
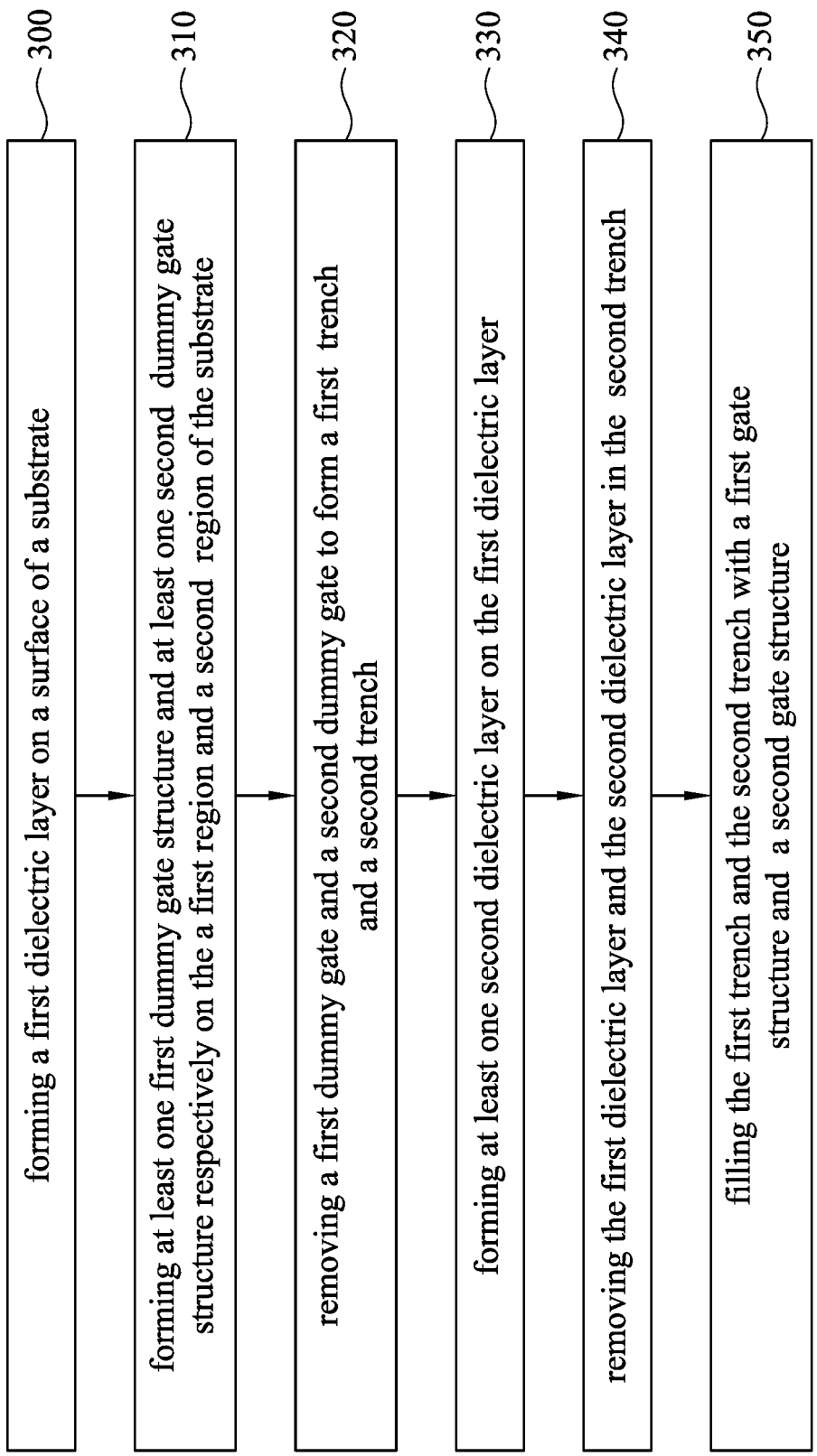
FIG. 10 is a flow chart of a method for manufacturing a semiconductor device in accordance with various embodiments.

Referring to FIG. 10 with FIG. 4A through FIG. 9, FIG. 10 is a flow chart of a method for manufacturing a semiconductor device in accordance with various embodiments. The method begins at operation 300, where a substrate 210 is provided, and a first dielectric layer 220 is formed on a surface 210a of the substrate 210. In some examples, the as shown in FIG. 4A through FIG. 4D, the substrate 210 is provided with first fin structures 212 and 214 and second fin structures 216 and 218. In some exemplary examples, the first fin structures 212 and 214 and the second fin structures 216 and 218 are formed by recessing the substrate 210, and the first fin structures 212 and 214 and the second fin structures 216 and 218 respectively protrude from a first region 210a' and a second region 210a" of the surface 210a of the substrate 210. Thus, the first fin structures 212 and 214, the second fin structures 216 and 218, and the substrate 210 are formed from the same material. For example, the first region 210a' of the substrate 210 may be an IO region, and the second region 210a" of the substrate 210 may be a core region.

Figure 4A:
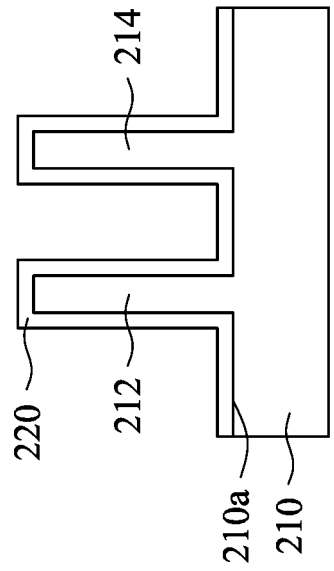
Figure 4B:
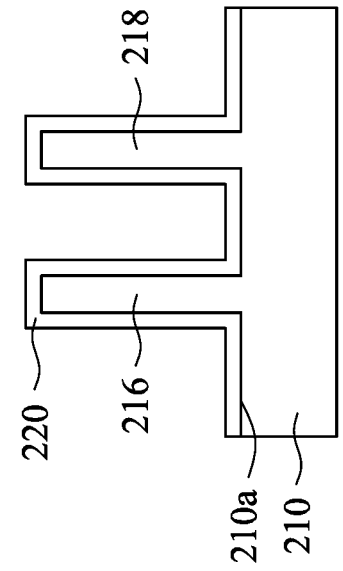
Figure 4C:
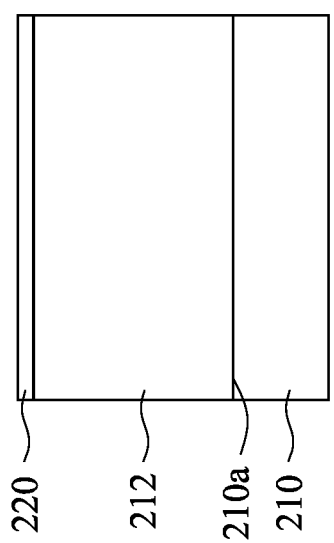
Figure 4D:
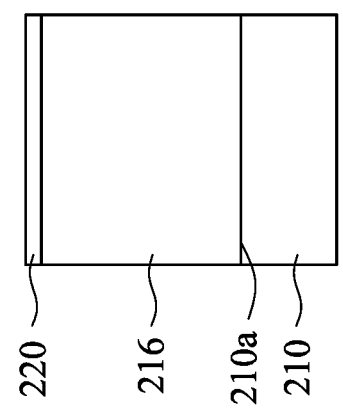
Figure 5B:
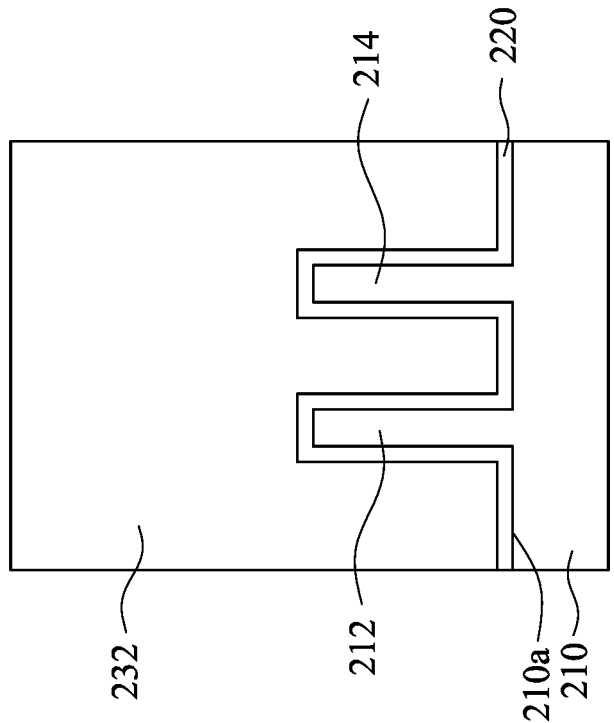
Figure 5A:
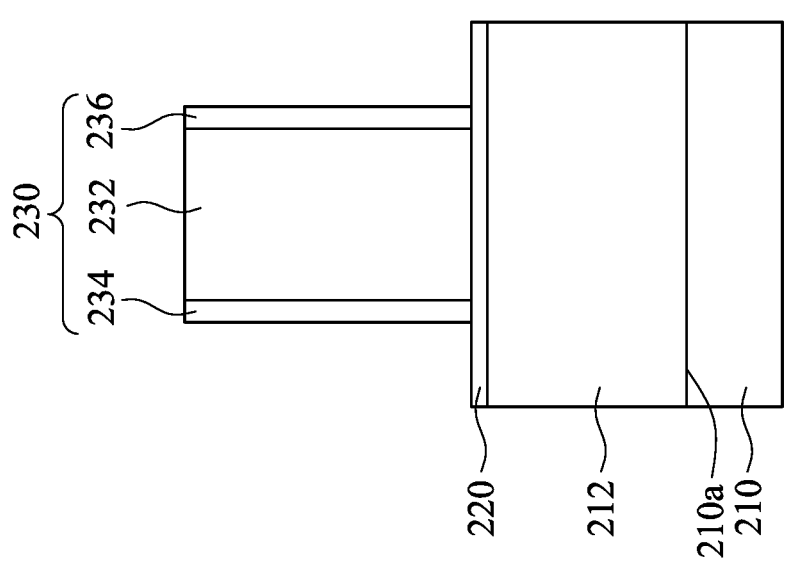
Figure 5D:
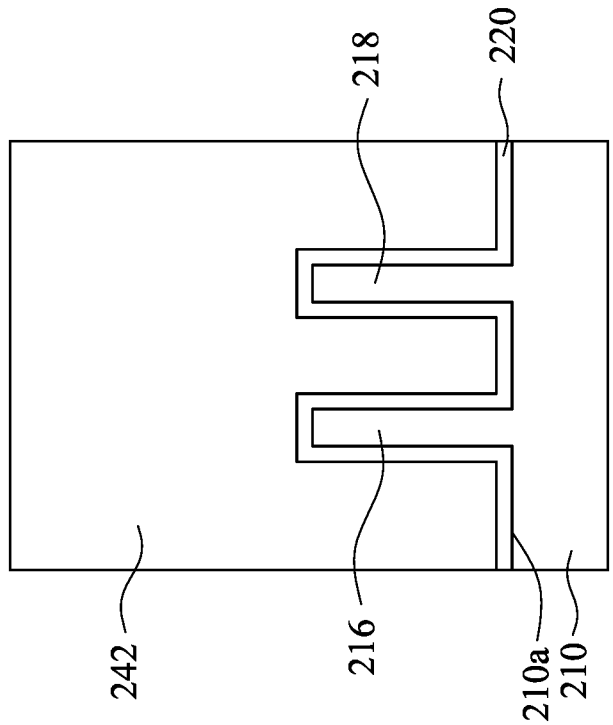
Figure 5C:
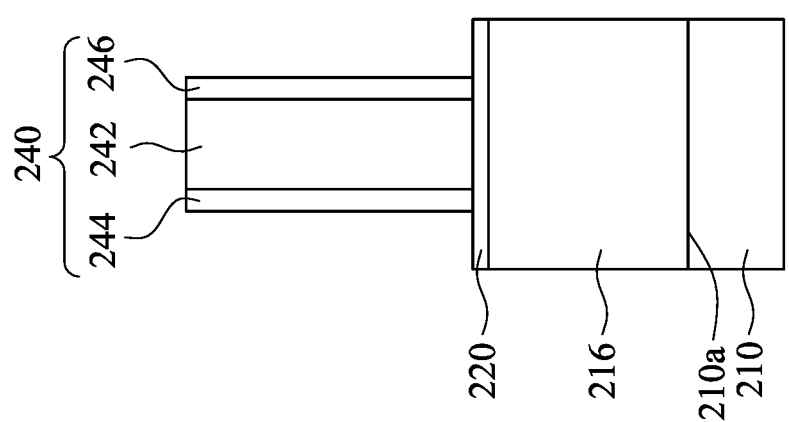

Referring to FIG. 4A through FIG. 4D again, the first dielectric layer 220 is formed to cover portions of the first fin structures 212 and 214, portions of the second fin structures 216 and 218, and a portion of the surface 210a of the substrate 210 by using, for example, a thermal oxidation technique or a chemical vapor deposition technique. In some exemplary examples, the first dielectric layer 220 is conformal to the first fin structures 212 and 214 and the second fin structures 216 and 218.

At operation 310, as shown in FIG. 5A through FIG. 5D, at least one first dummy gate structure 230 and at least one second dummy gate structure 240 are respectively formed on the first dielectric layer 220 across the portions of the first fin structures 212 and 214 and the portions of the second fin structure 216 and 218. The first dummy gate structure 230 and the second dummy gate structure 240 are respectively disposed on the first region 210a' and the second region 210a" of the surface 210a of the substrate 210. In some exemplary examples, the first dummy gate structure 230 is formed to include a first dummy gate 232 and two first spacers 234 and 236, in which the first dummy gate 232 is sandwiched between the first spacers 234 and 236. The second dummy gate structure 240 is formed to include a second dummy gate 242 and two second spacers 244 and 246, in which the second dummy gate 242 is sandwiched between the second spacers 244 and 246.

At operation 320, as shown in FIG. 6A through FIG. 6D, the first dummy gate 232 and the second dummy gate structure 240 are removed by using an etch technique, so as to respectively form a first trench 238 between the first spacers 234 and 236, and a second trench 248 between the second spacers 244 and 246. The first trench 238 is formed over the portions of the first fin structures 212 and 214. The second trench 248 is formed over the portions of the second fin structures 216 and 218. The first trench 238 is formed to include first side surfaces 238a and a first bottom surface 238b, in which the first side surfaces 238a are respectively connected to opposite sides of the first bottom surface 238b. The second trench 248 is formed to include second side surfaces 248a and a second bottom surface 248b, in which the second side surfaces 248a are respectively connected to opposite sides of the second bottom surface 248b.

At operation 330, referring to FIG. 6A through FIG. 6D again, at least one second dielectric layer 250 is formed on the first dielectric layer 220, the first side surfaces 238a and the first bottom surface 238b of the first trench 238, and the second side surfaces 248a and the second bottom surface 248b of the second trench 248 by using, for example, a chemical vapor deposition technique. In some exemplary examples, the second dielectric layer 250 is conformal to the first trench 238 and the second trench 248. A material forming the second dielectric layer 250 may be the same as a material forming the first dielectric layer 220. In some examples, two or more second dielectric layers 250 may be formed.

At operation 340, as shown in FIG. 7A through FIG. 7D, a portion of the first dielectric layer 220 and a portion of the second dielectric layer 250 in the second trench 248 are removed to expose the second side surfaces 248a of the second trench 248 and to extend the second bottom surface 248b of the trench 248 to tops of the second fin structures 216 and 218. In some exemplary examples, in removing the portion of the first dielectric layer 220 and the portion of the second dielectric layer 250, the other portion of the second dielectric layer 250 may be masked, and the portion of the second dielectric layer 250 and the portion of the first dielectric layer 220 are etched.

At operation 350, as shown in FIG. 8A through FIG. 8D, the first trench 238 and the second trench 248 are respectively filled with a first gate structure 260 and a second gate structure 270. The first gate structure 260 is disposed on the second dielectric layer 250 within the first trench 238, and the second gate structure 270 is disposed on the second fin structures 218 and 218 and portions of the surface 210a of the substrate 210 within the second trench 248.

In some examples, referring to FIG. 8A and FIG. 8B again, the first gate structure 260 is formed to include a gate 262, a metal layer 264, and a third dielectric layer 266. The third dielectric layer 266 is formed to cover the second dielectric layer 250 on the first side surfaces 238a and the first bottom surface 238b of the first trench 238 by using, for example, a chemical vapor deposition technique. In some exemplary examples, the third dielectric layer 266 is conformal to the second dielectric layer 250. The metal layer 264 is formed to cover the third dielectric layer 266 within the first trench 238 by using, for example, a chemical vapor deposition technique or a physical vapor deposition technique. In some exemplary examples, the metal layer 264 is conformal to the third dielectric layer 266 within the first trench 238. A gate 262 is formed on the metal layer 264 and fills the first trench 238 to substantially complete a first device 280. The gate 262 may be formed by using a physical vapor deposition technique. In some exemplary examples, the first device 280 is an IO device.

In some examples, as shown in FIG. 8C and FIG. 8D, the second gate structure 270 is formed to include a gate 272, a metal layer 274, and a third dielectric layer 276. The third dielectric layer 276 is formed to cover the second side surfaces 248a and the second bottom surface 248b of the second trench 248. In some exemplary examples, the third dielectric layer 276 is conformal to the second side surfaces 248a and the second bottom surface 248b of the second trench 248. The metal layer 274 is formed to cover the third dielectric layer 276 within the second trench 248 by using, for example, a chemical vapor deposition technique or a physical vapor deposition technique. In some exemplary examples, the metal layer 274 is conformal to the third dielectric layer 276 within the second trench 248. The gate 272 is formed on the metal layer 274 to substantially complete a second device 290, and thus substantially completing the semiconductor 200 shown in FIG. 9. The gate 272 may be formed by using a physical vapor deposition technique. The first gate structure 260 and the second gate structure 270 may be formed simultaneously. In some exemplary examples, the second device 290 is a core device.

In some embodiments of the present disclosure, a semiconductor device includes a substrate, a first gate structure, a plurality of first gate spacers, a second gate structure, and a plurality of second gate spacers. The substrate has a first fin structure and a second fin structure. The first gate structure is over the first fin structure, in which the first gate structure includes a first high dielectric constant material and a first metal over the first high dielectric constant material. The first gate spacers are on opposite sides of the first gate structure, in which a bottom surface of the first high dielectric constant material is higher than bottom surfaces of the first gate spacers. The second gate structure is narrower than the first gate structure and over the second fin structure, in which the second gate structure includes a second high dielectric constant material and a second metal over the second high dielectric constant material. The second gate spacers are on opposite sides of the second gate structure, in which a bottom surface of the second high dielectric constant material is lower than bottom surfaces of the second gate spacers.

In some embodiments of the present disclosure, a semiconductor device includes a substrate, a first gate structure, a plurality of first gate spacers, a second gate structure, and a plurality of second gate spacers. The substrate has a first fin structure and a second fin structure. The first gate structure is over the first fin structure, in which the first gate structure comprises a first high dielectric constant material and a first metal over the first high dielectric constant material. The first gate spacers are on opposite sides of the first gate structure, in which the first gate spacers are separated from the first high dielectric constant material of the first gate structure. The second gate structure is narrower than the first gate structure over the second fin structure, in which the second gate structure includes a second high dielectric constant material and a second metal over the second high dielectric constant material. The second gate spacers are on opposite sides of the second gate structure, in which the second gate spacers are in contact with an upper portion of the second high dielectric constant material and is separated from a lower portion of the second high dielectric constant material.

In some embodiments of the present disclosure, a semiconductor device includes a substrate, a first gate structure, a plurality of first gate spacers, a second gate structure, a plurality of second gate spacers, a first dielectric layer, and a second dielectric layer. The substrate has a first region and a second region. The first gate structure is over the substrate within the first region, in which the first gate structure includes a first high dielectric constant material and a first metal over the first high dielectric constant material. The first gate spacers are on opposite sides of the first gate structure. The second gate structure is over the substrate within the second region, in which the second gate structure includes a second high dielectric constant material and a second metal over the second high dielectric constant material. The second gate spacers are on opposite sides of the second gate structure, the second gate spacers being separated by a distance shorter than a distance separating the first gate spacers. The first dielectric layer extends from a position under one of the first gate spacers to a position below the first gate structure. The second dielectric layer is between the first gate spacers and the first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first fin structure and a second fin structure;
   a first gate structure over the first fin structure, wherein the first gate structure comprises a first high dielectric constant material and a first metal over the first high dielectric constant material;
   a plurality of first gate spacers on opposite sides of the first gate structure, wherein a bottom surface of the first high dielectric constant material is higher than bottom surfaces of the first gate spacers;
   a second gate structure narrower than the first gate structure and over the second fin structure, wherein the second gate structure comprises a second high dielectric constant material and a second metal over the second high dielectric constant material; and
   a plurality of second gate spacers on opposite sides of the second gate structure, wherein a bottom surface of the second high dielectric constant material is lower than bottom surfaces of the second gate spacers and is in contact with the second fin structure.

2. The semiconductor device of claim 1, wherein the second high dielectric constant material of the second gate structure contacts the second fin structure, and the first high dielectric constant material of the first gate structure is separated from the first fin structure.

3. The semiconductor device of claim 1, further comprising a dielectric layer over the substrate, wherein the dielectric layer has a first portion extending from a position between the first gate spacers and the first fin structure to a position between the first gate structure and the first fin structure.

4. The semiconductor device of claim 3, wherein the dielectric layer has a second portion between the second gate spacers and the second fin structure, and the second portion of the dielectric layer is in contact with the second high dielectric constant material of the second gate structure.

5. The semiconductor device of claim 3, wherein a position between the second gate structure and the second fin structure is free of the dielectric layer.

6. The semiconductor device of claim 1, wherein the first high dielectric constant material of the first gate structure is separated from the first gate spacers, and the second high dielectric constant material of the second gate structure is in contact with the second gate spacers.

7. The semiconductor device of claim 6, wherein the first high dielectric constant material of the first gate structure is separated from the first gate spacers by a dielectric layer.

8. A semiconductor device, comprising:
   a substrate having a first fin structure and a second fin structure;
   a first gate structure over the first fin structure, wherein the first gate structure comprises a first high dielectric constant material and a first metal over the first high dielectric constant material;
   a plurality of first gate spacers on opposite sides of the first gate structure, wherein an entirety of the first gate spacers is separated from the first high dielectric constant material of the first gate structure by at least one material that is different than the first gate spacers;
   a second gate structure narrower than the first gate structure over the second fin structure, wherein the second gate structure comprises a second high dielectric constant material and a second metal over the second high dielectric constant material; and
   a plurality of second gate spacers on opposite sides of the second gate structure, wherein the second gate spacers are in contact with an upper portion of a sidewall of the second high dielectric constant material and is separated from a lower portion of the sidewall of the second high dielectric constant material.

9. The semiconductor device of claim 8, wherein the second high dielectric constant material of the second gate structure contacts the second fin structure, and the first high dielectric constant material of the first gate structure is separated from the first fin structure.

10. The semiconductor device of claim 8, wherein the at least one material is a dielectric layer.

11. The semiconductor device of claim 10, wherein the dielectric layer extends from a sidewall of the first high dielectric constant material of the first gate structure to a bottom surface of the first high dielectric constant material of the first gate structure.

12. The semiconductor device of claim 8, further comprising a dielectric layer under the second gate spacers, wherein the lower portion of the second high dielectric constant material is in contact with the dielectric layer.

13. The semiconductor device of claim 12, wherein the dielectric layer is further under the first gate spacers and the first gate structure.

14. The semiconductor device of claim 8, further comprising:
a first dielectric layer between the first gate structure and the first gate spacers; and
a second dielectric layer between the first gate spacers and the first fin structure.

15. The semiconductor device of claim 14, wherein the first dielectric layer and the second dielectric layer are made of the same material.

16. A semiconductor device, comprising:
a substrate having a first region and a second region;
a first gate structure over the substrate within the first region, wherein the first gate structure comprises a first high dielectric constant material and a first metal over the first high dielectric constant material;
a plurality of first gate spacers on opposite sides of the first gate structure;
a second gate structure over the substrate within the second region, wherein the second gate structure comprises a second high dielectric constant material and a second metal over the second high dielectric constant material;
a plurality of second gate spacers on opposite sides of the second gate structure, the second gate spacers being separated by a distance shorter than a distance separating the first gate spacers;
a first dielectric layer extending from a position under one of the first gate spacers to a position below the first gate structure, wherein the first dielectric layer is below and in contact with bottom surfaces of the first gate spacers; and
a second dielectric layer has a lateral portion and a vertical portion extending upwardly from an end of the lateral portion, wherein the vertical portion is laterally between the first gate spacers and the first gate structure, and the lateral portion is vertically between the first gate structure and the first dielectric layer.

17. The semiconductor device of claim 16, wherein the first dielectric layer is under the second gate spacers.

18. The semiconductor device of claim 17, wherein a bottom surface of the first high dielectric constant material of the first gate structure is higher than a top surface of the first dielectric layer, and a bottom surface of the second high dielectric constant material of the second gate structure is lower than the top surface of the first dielectric layer.

19. The semiconductor device of claim 16, wherein the second high dielectric constant material of the second gate structure is in contact with the second gate spacers.

20. The semiconductor device of claim 16, wherein a bottom surface of the first high dielectric constant material of the first gate structure is higher than a bottom surface of the second high dielectric constant material of the second gate structure.

* * * * *